(12) United States Patent
Lees et al.

(10) Patent No.: US 6,226,032 B1
(45) Date of Patent: *May 1, 2001

(54) CRYSTAL DIAMETER CONTROL SYSTEM

(75) Inventors: David K. Lees; Henry C. Latka, both of Rochester, NY (US)

(73) Assignee: General Signal Corporation, Stamford, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/872,602

(22) Filed: Jun. 10, 1997

Related U.S. Application Data

(60) Provisional application No. 60/021,830, filed on Jul. 16, 1996.

(51) Int. Cl.[7] .............................. H04N 7/18; C30B 15/00

(52) U.S. Cl. ................... 348/85; 348/86; 117/14

(58) Field of Search .................... 348/85, 86, 87, 348/88, 89, 90; 422/249, 106; 156/601; 117/14; 396/79; 259/823; 356/127; 369/69; 354/149; 702/97; H04N 7/18; C30B 15/00

(56) References Cited

U.S. PATENT DOCUMENTS

| | | |
|---|---|---|
| 3,958,129 | 5/1976 | Clement et al. |
| 4,277,441 * | 7/1981 | Sachs ................... 422/105 |
| 4,794,263 | 12/1988 | Katsuoka et al. |
| 4,847,647 * | 7/1989 | Ueda ..................... 354/149 |
| 4,893,927 * | 1/1990 | Miller ................... 356/127 |
| 4,926,357 | 5/1990 | Katsuoka et al. |
| 5,170,061 | 12/1992 | Baba . |
| 5,176,787 | 1/1993 | Kawashima et al. |
| 5,240,684 * | 8/1993 | Baba et al. ............ 422/249 |
| 5,286,461 | 2/1994 | Koziol et al. |
| 5,288,363 | 2/1994 | Araki . |
| 5,321,681 * | 6/1994 | Ramsay et al. ........ 369/69 |
| 5,343,538 * | 8/1994 | Kasdan ................... 382/18 |
| 5,406,417 * | 4/1995 | Denvenyi ............... 259/823 |
| 5,528,357 * | 6/1996 | Davis ..................... 356/124 |
| 5,537,484 * | 7/1996 | Kobayashi ............. 382/124 |
| 5,653,799 * | 8/1997 | Fuerhoff ................ 117/14 |
| 5,666,565 * | 9/1997 | Wakabayashi et al. . 396/79 |
| 5,918,196 * | 6/1999 | Jacobson ............... 702/97 |

FOREIGN PATENT DOCUMENTS

| | | |
|---|---|---|
| 0285943 | 10/1988 | (EP) . |
| 0450502 | 10/1991 | (EP) . |
| 0599350 | 6/1994 | (EP) . |
| 59-018192 | 1/1984 | (JP) . |
| 62-087482 | 4/1987 | (JP) . |
| 63-274687 | 11/1988 | (JP) . |
| 03100508 | 4/1991 | (JP) . |

OTHER PUBLICATIONS

"Pulling of Silicon Mono Crystals" by M. Dreckmann, IBM Technical Disclosure Bulletin, vol. 11, No. 10, Mar. 1969, New York, pp. 1374–1375.

* cited by examiner

Primary Examiner—Chris Kelley
Assistant Examiner—Tung Vo
(74) Attorney, Agent, or Firm—Pepper Hamilton LLP

(57) ABSTRACT

A system controls the diameter of both a neck region and a full diameter region of a monocrystalline rod being pulled from molten material held in a crucible. The system uses a video camera viewing light reflected from a meniscus around the rod where the rod emerges from a melt surface of the molten material. The video camera has a zoom lens for enlarging an image of the meniscus during growth of the neck of the rod and for reducing an image of the meniscus during growth of a full diameter body of the rod. A computer controlling a pull rate for the neck growth of the rod is rapidly responsive to a count of total camera pixels illuminated by the image of the meniscus during neck growth.

14 Claims, 7 Drawing Sheets

CRYSTAL DIAMETER CONTROL SYSTEM

This application claims the benefit of U.S. Provisional Application Ser. No. 60/021,830, filed on Jul. 16, 1996, which provisional application is incorporated by reference herein.

TECHNICAL FIELD

Diameter control systems for pulling monocrystalline rods by the Czochralski (CZ) method.

BACKGROUND

Several control systems have been developed to control the diameter of a monocrystalline rod being pulled by the CZ method. These involve optical scanning systems and CCD camera systems that derive crystal diameter information from a reflective meniscus around the crystal's emergence from the melt surface. Although these systems work fairly well in controlling the diameter of the body of the crystalline rod, improved precision is always welcome, especially since the completed rod must be ground to a uniform diameter before it is sliced into wafers.

The existing systems have significantly more difficulty in accurately controlling the diameter of the neck of the crystal, which is formed as the pulling process is initiated. The crystal growth from a seed crystal is necked down to a diameter of 3 to 4 millimeters before the diameter is enlarged to a shoulder and thereafter kept constant as the cylindrical body of the rod is pulled. Forming larger diameter cylindrical bodies of 300 millimeters as desired by the wafer processing industry requires that the neck of the crystal be made somewhat larger, at a diameter of about 5 millimeters. One of the functions of the crystal neck forming process is to reduce crystal defects in the early stages of crystal growth. Larger neck diameters are less effective at reducing defects, but defect reduction is improved by maintaining well-controlled diameters in the crystal neck region. Thus, improving the accuracy of diameter control of the neck region of the crystal becomes especially important for reducing defects in necks that are necessarily somewhat larger in diameter, because of the increased weight the necks must support as the diameter of the body of the crystal being pulled increases.

The improvements we have devised in a crystal diameter control system especially improve the accuracy of the diameter maintained in the neck region of the crystal. Our system also improves on the accuracy and versatility of the diameter control of the cylindrical body of the crystalline rod.

SUMMARY OF THE INVENTION

Our improved control system uses a CCD camera aimed into the crystal pulling crucible so as to view light reflected from a meniscus formed around the crystal's emergence from the melt level. Light from the meniscus is imaged as a luminous arc on a pixel array of the CCD camera, and the output signal from the camera is preferably adjusted using the reflectance of the melt level surface as a standard and selecting luminance of the meniscus arc as a predetermined value above the luminance of the melt surface. The signal from the image of the arc is then processed to determine the location and dimensional configuration of the luminous arc, preferably several times per second.

The diameter of the crystal is calculated by a computer from the optical information derived from the arc imaged on the CCD camera. This involves selecting one or more chords across the luminous arc and determining the chord lengths from signals produced by the output of the CCD camera. From the chord lengths, the diameter of the crystalline rod is calculated, with the computer also receiving an input from a melt level measurement system. This preferably involves a laser beam reflected off the melt level at an angle that results in light movement relative to a sensor as the melt level changes. Computer control of the diameter measurement calculation allows software control so that the diameter measurement process can be varied, calibrated, and improved based on experience.

Calibration of the diameter calculation can be done with a movable viewing telescope that sights opposite edges of the crystal diameter. The light reflecting from the meniscus has a width and a diameter larger than the crystal so that the crystal diameter calculation corrects for this.

For controlling crystal diameter at the neck region of the crystal, the process uses as an additional input the total number of pixels in the CCD camera that are illuminated by the image of the meniscus arc around the crystal neck. We have discovered that changes in crystal diameter as the neck region is being pulled produce stronger signal variations in the total pixel illumination count than in the crystal diameter calculation. Our control system exploits this by responding in a short time duration manner to changes in the pixel illumination count and in responding over a longer time duration to changes in the crystal diameter calculation. This is preferably done by forming a ratio of the total pixel illumination count divided by the diameter measurement. This ratio is filtered over a brief duration and applied to a controller adjusting the pull rate for the crystal.

DRAWINGS

DETAILED DESCRIPTION

Figure 1:
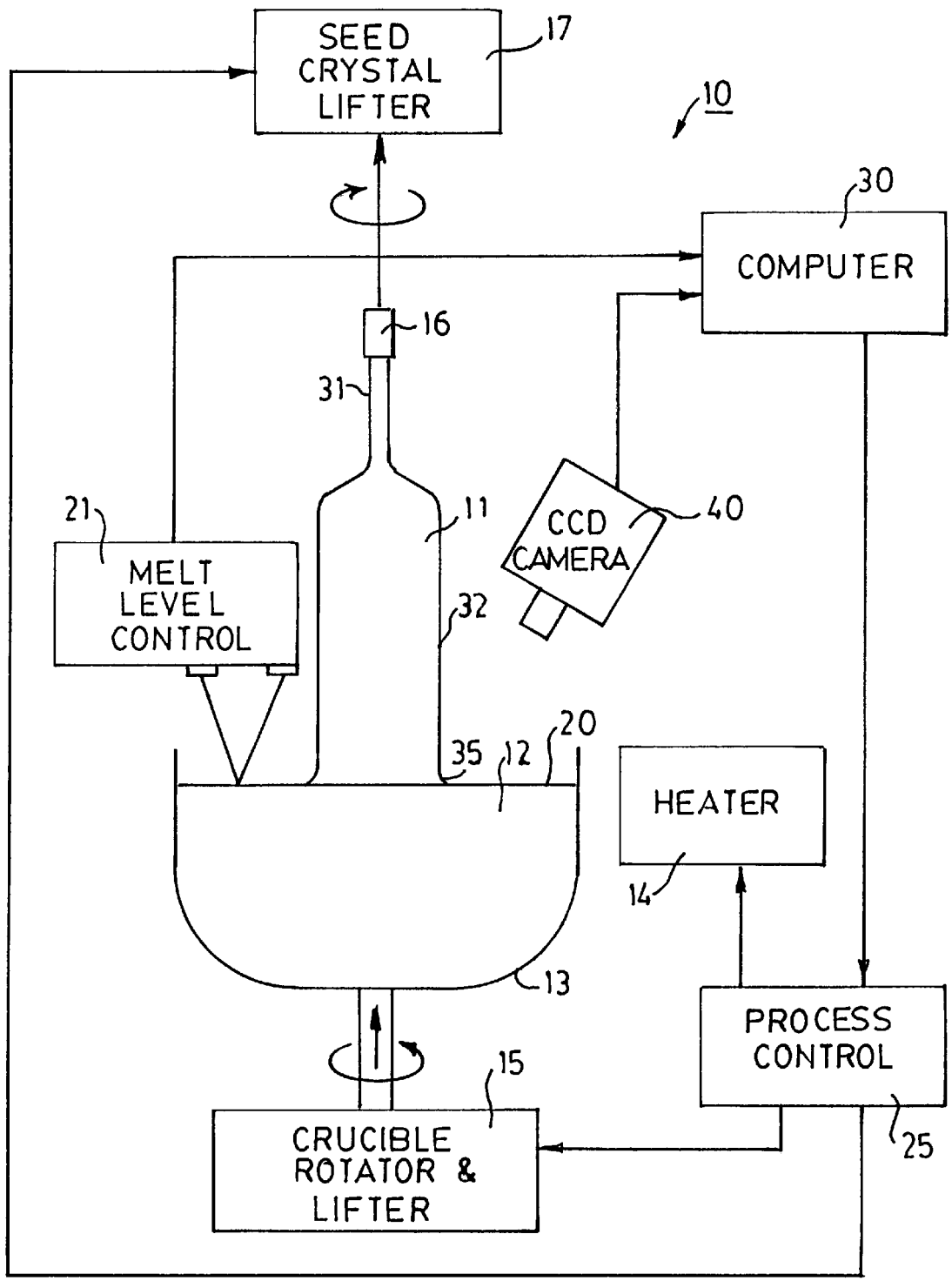
FIG. 1 is a schematic view of interrelated elements of the inventive crystal diameter control system.

Control system 10, as schematically shown in FIG. 1, includes several known components for pulling a monocrystalline rod 11 from a melt 12. These include a crucible 13, a heater 14, and a crucible rotator and lifter 15 that rotates crucible 13 and lifts it during the crystal pulling process to keep the surface level 20 of melt 12 approximately at the elevation desired for optimum crystal growth conditions. Sometimes the melt level is varied in a controlled manner during a run to keep the melt at a level that best suits crystal growing conditions. Often, the crucible is "overdriven" to raise the melt level over the course of the crystal growth. Known components also include seed crystal 16 and seed crystal lifter 17 that lifts and rotates crystalline rod 11 as it emerges from melt 12. Process control systems of various kinds have been applied to these components in the past; and in the present invention, the control elements include process controller 25, computer 30, CCD video camera 40, and melt level controller 21. An actual crystal pulling system includes many more components that are omitted here for simplicity of illustration.

Figure 3:
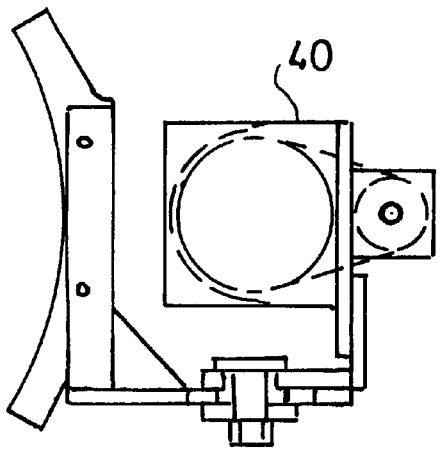
FIG. 3 is a fragmentary and partially schematic plan view of the camera and mount of FIG. 2.
Figure 2:
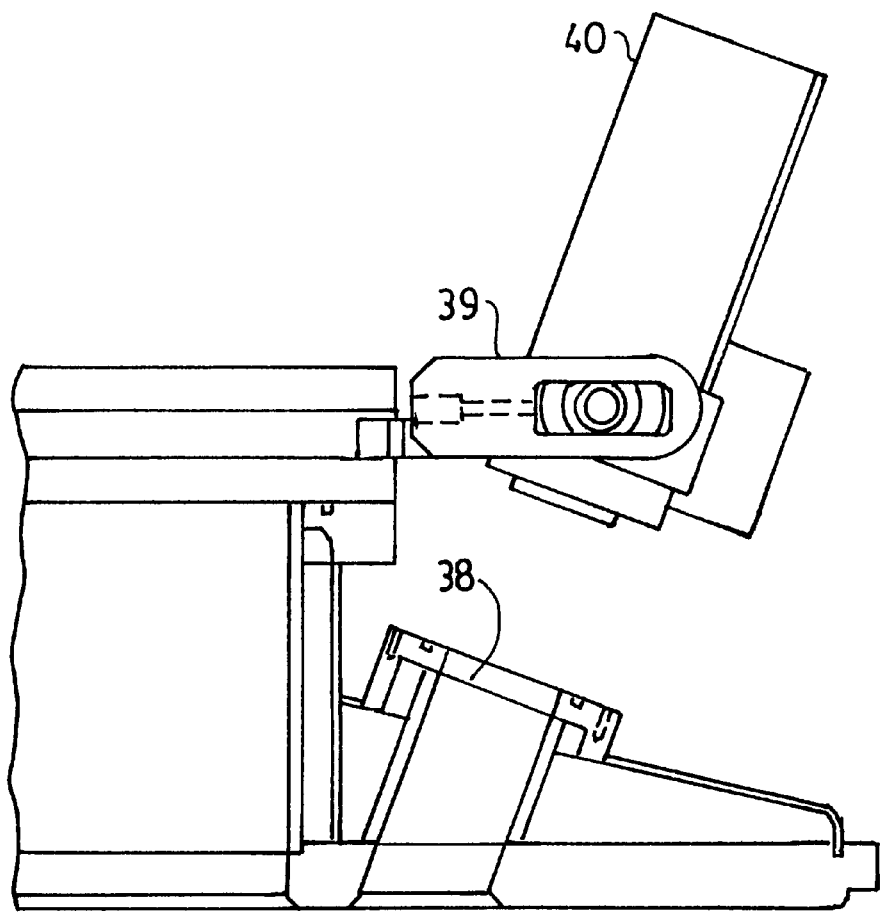
FIG. 2 is a partially schematic, fragmentary elevational view of a CCD camera and mount for use in the inventive system.
Figure 4:
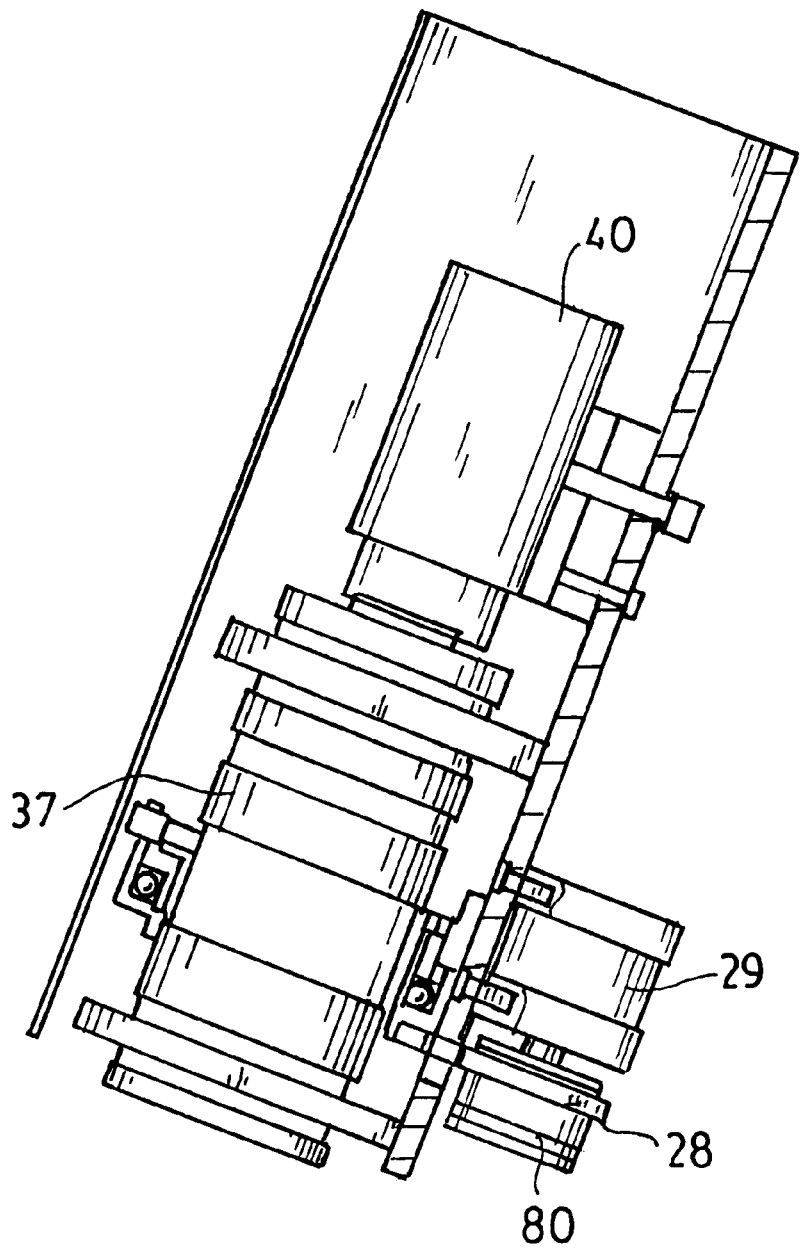
FIG. 4 is a fragmentary and partially cut-away elevational view of a pneumatic drive for a zoom lens of the camera of FIG. 2.

CCD camera 40 is important to the diameter control function of the inventive system and is illustrated in greater detail in FIGS. 2–4. It is mounted in a preferably adjustable position on a bracket 39 so that it can be aimed through viewing port 38 to view melt surface 20, crystalline rod 11, and a meniscus 35 that surrounds rod 11 where it emerges from molten melt 12. Light that is present above the melt surface 20 in crucible 13 reflects from meniscus 35 and other surfaces, which are viewed by camera 40.

Camera 40 preferably includes a zoom lens 37 so that it can zoom in on the crystalline rod and its meniscus to enlarge the camera image during the neck growth phase and can zoom back out to reduce the camera image of the crystalline cylinder and its larger meniscus during the growth of the cylindrical body 32 of crystalline rod 11. Zoom lens 37 allows camera 40 to stay in a fixed position during crystal growth and be able to image sufficient detail of both the small crystalline neck 31 and the larger crystal body 32. Operating camera 40 from a fixed position throughout the pulling of crystalline rod 11 avoids signal discontinuities that occur from changing the aim of the camera or other optical element viewing crystal diameter as the crystal is being pulled. The fixed camera 40 with its zoom lens 37 avoids such discontinuities, which have caused problems with prior art control systems.

Melt level is sometimes deliberately varied during the pulling of a crystal, and raising the melt level while the crystal is being pulled from the run causes prior art fixed scan positions to erroneously calculate the crystal diameter. This causes a taper in the crystal from applying an incorrect pulling rate derived from the miscalculation of diameter. Signal discontinuities arise when prior systems attempt to compensate by changing the scan locations in fixed steps. Because our system feeds melt level position into the diameter calculation, as explained below, our system can compensate continuously for changes in the level of the melt. Also, the full two-dimensional array of the viewing system of camera 40 allows corrections required by changes in melt level to be made in software only, with no mechanical movement of camera 40 being required. This improves over prior art systems that have required movement of a sensor monitoring crystal diameter.

Zoom lens 37 changes viewing angles by rotation of its lens barrel, which is preferably done with a motor. The environment proximate to the pulling of crystalline rod 11 is often subject to strong magnetic fields used for controlling eddy currents within melt 12, and such magnetic fields would impair the operation of an electric motor driving zoom lens 37. To solve this problem, we have devised pneumatic drive motor 29 powered by an air supply for turning a drive belt 28 that rotates the barrel of zoom lens 37 to accomplish zoom adjustments. Pneumatic motor 29 is not affected by strong magnetic fields and can reliably operate zoom lens 37 in the environment of camera 40. A suitable drive for adjustment of zoom lens 37 can also be powered by fluids other than air and can transmit motion to the barrel of lens 37 by means other than a drive belt.

An important aspect of the lens drive is a friction clutch 80 that drives the lens against an end stop with a repeatable and nondestructive force. This establishes reference locations for zoom effects. The friction clutch is designed so that it can slip readily, and the pneumatic motor 29 is arranged to drive somewhat beyond the range of movement necessary for full travel of the zoom lens. This ensures that the zoom lens is positioned at the extreme ends of its possible travel with each zoom motion; and when the lens motion is completed and comes to a stop, the friction clutch 80 slips until a new motion is required.

Figure 5:
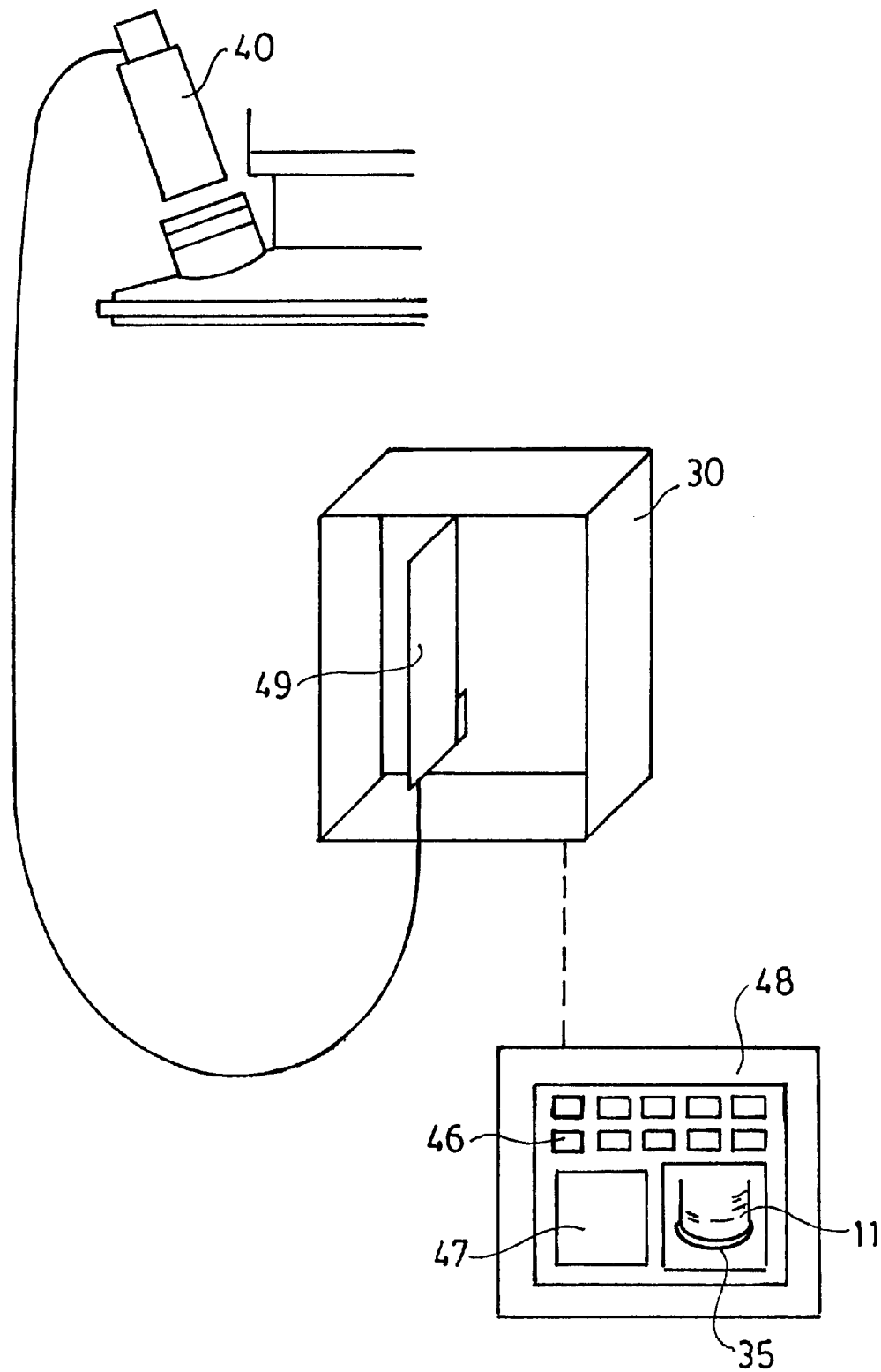
FIG. 5 is a schematic view showing the interrelationship of the camera of FIG. 2 with a computer and a computer monitor of the inventive control system.

As best shown in FIG. 5, the output from a pixel array within video camera 40 transmits the meniscus image to a high speed frame grabber board 49 in computer 30, which preferably has the form of an industrial PC. Computer 30 preferably has the capability of processing the video signal in various ways, including setting light level thresholds to optimize signals for diameter control. At least several frames of video image per second are preferably processed by computer 30, which in a preferred embodiment of the invention processes 15 frames per second. This provides a rapid replenishment of the video image so that the system can account for eccentric rotation of the crystalline rod and departures of its circumference from circular.

A typical monitor display 48 includes a view of crystal rod 11 and its meniscus 35, a field for data display 47, and touch control regions 46 for operator intervention. Data display 47 can contain calculated pulling diameter, elapsed pulling time, melt level, pulling rate, and many other parameters involved in the control system. Keyboards and other interface devices can substitute for touch control regions 46. A program used for operating computer 30 can vary the information displayed on monitor 48 and can also vary many of the parameters and signals involved in controlling crystal growth diameter.

Figure 6:
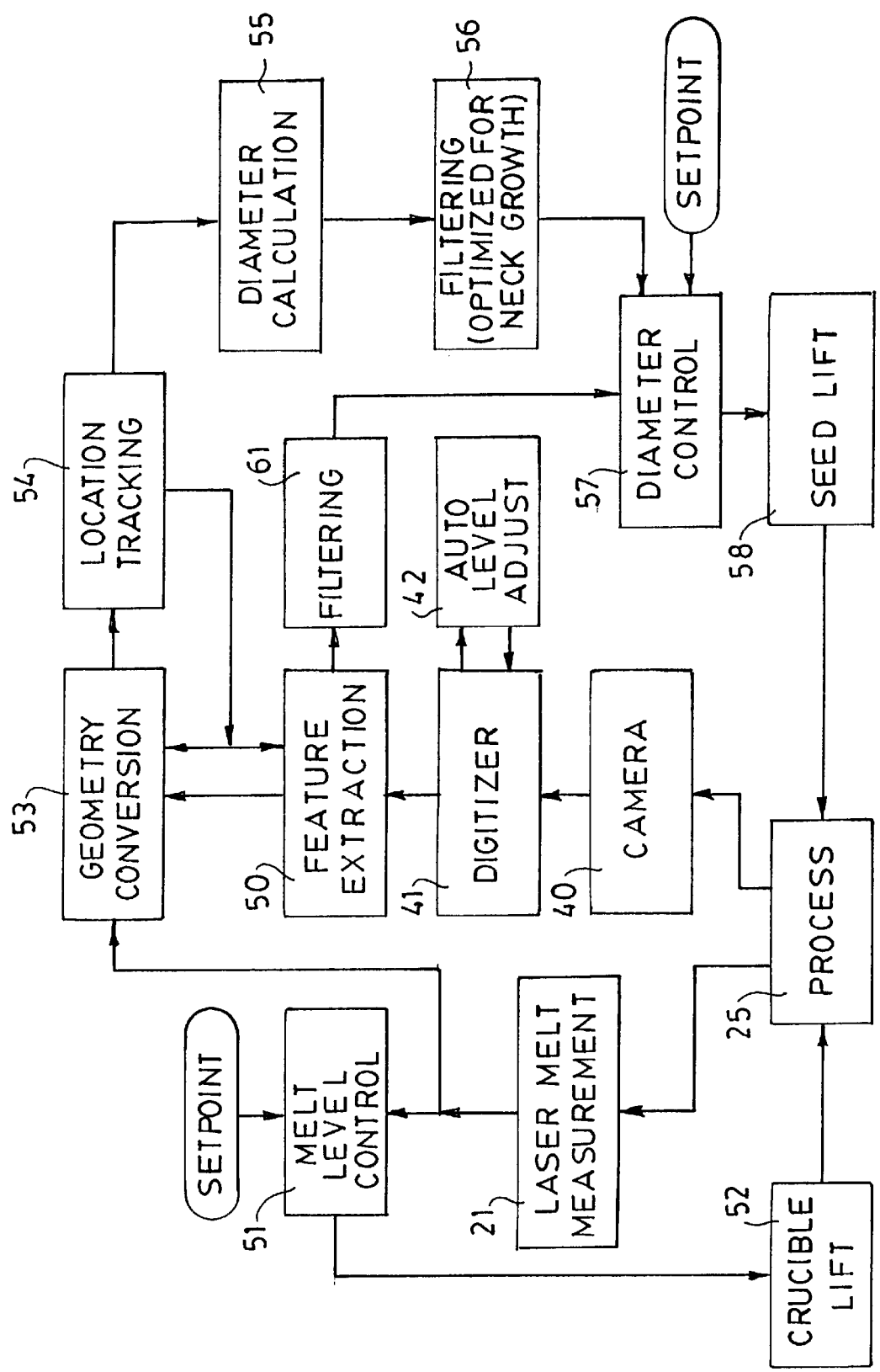
FIG. 6 is a schematic block diagram of interactions of working elements of the inventive control system.
Figure 7:
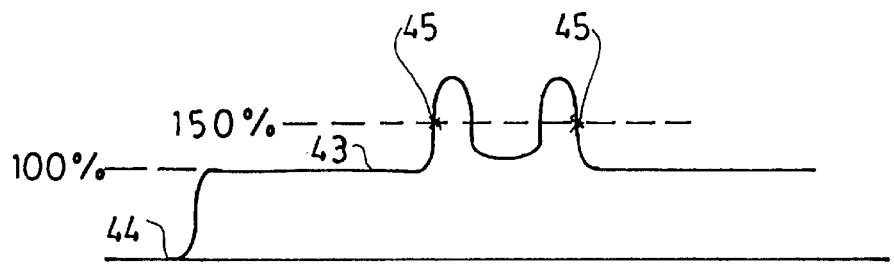
FIG. 7 is a trace of a signal output from the camera of FIG. 2 occurring during neck growth of a crystal being pulled.
Figure 8:
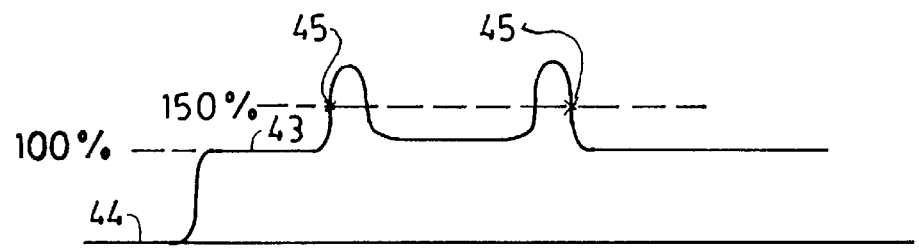
FIG. 8 is a trace of a signal output from the camera of FIG. 2 occurring during body growth of a crystal being pulled.

In the flow diagram of FIG. 6, the signal output of video camera 40 is digitized by digitizer 41 with the aid of an automatic signal level adjuster 42. This preferably assigns a reference signal value 43 to the portion of the image representing melt surface 20 at a level above a dark base line 44, as shown in FIGS. 7 and 8. More intense light reflected from meniscus 35 is then set at a signal intensity level 45 that is higher than the level represented by the melt surface signal 43. The signal level for the more intense meniscus signal 45 is preferably set at 150% of reference signal 43 derived from melt surface 20, although the peak intensity for the meniscus signal may reach as high as 200% to 300% of the reference signal 43. Other ratios can be selected to establish the higher intensity of signal 45 over reference signal 43. Automatic adjustment to these values under changing illumination conditions above melt level 20 assures a steady and reliable signal to be processed for diameter control.

Figure 10:
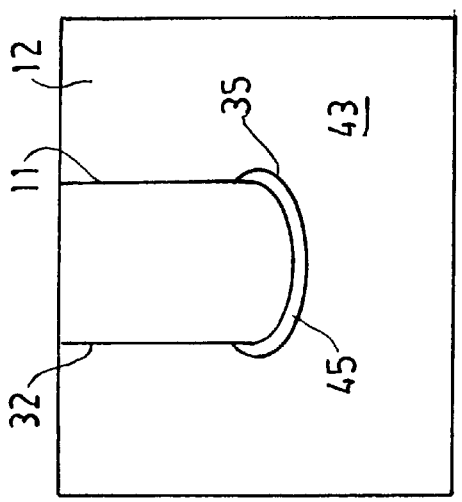
FIG. 10 is a schematic view of a crystal body, meniscus, and melt surface as seen by the camera of FIG. 2.
Figure 11:
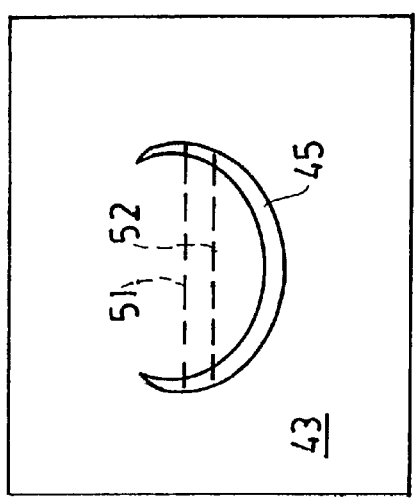
FIG. 11 is the meniscus portion of the view of FIG. 10 used for developing a control signal such as shown in FIG. 8.

Feature extraction 50 then extracts relevant information from the signal representing the image of meniscus 35 for processing by computer 30, which in turn is involved in the feature extraction. Digitizer 41 and feature extraction 50 are preferably performed by frame grabber board 49 as shown in FIG. 5. The scanning and extraction of usable information from the meniscus image proceeds in different ways during different phases of the crystal growth. For the simpler case of diameter control during growth of the cylindrical body 32 of crystal 11, the relevant feature of the meniscus image that is extracted for processing by computer 30 is the length of one or more chords spanning the visible arc of the meniscus. Preferably several chords are taken, and preferably these can be taken at different locations along the meniscus arc. Each chord that is selected for measurement produces a signal such as shown in FIG. 8. Whatever chords are used are preferably parallel to each other, and longer chords are generally preferred to shorter ones. A pair of such chords 51 and 52 are shown spanning the meniscus signal 45 of FIG. 11, which is extracted from the video camera view of FIG. 10. Reference numbers outside the frame of FIG. 10 indicate the actual elements imaged, and reference numbers inside the frame of FIG. 10 indicate the signals being processed. Any number of chords 51 and 52 can be taken; and preferably monitor 48 displays where the chords are located and shows the end points of the chords, which determine the chord lengths. A signal along one of the chords 51 or 52 appears as shown in FIG. 8, where a chord length is established by the distance between the signal intensity levels 45.

Since only the end regions of the selected chords 51 and 52 are needed for signal processing, it is possible for other accessories that may be deployed above melt surface 20 to partially block the view of camera 40 and chords 51 and 52, without interfering with accurate signal generation. This improves over prior art diameter control systems that require an unobstructed full view of the arc of meniscus 35 to produce a reliable signal. Line scanning devices in particular can be defeated by anything obstructing the system's vision of a full linear length of a chord extending across the meniscus arc. Avoiding such an inhibition makes the present system more versatile and adaptable to a multitude of crystal pulling conditions. The fact that our system is based on software processing of the image viewed by camera 40 makes our system also easier to reconfigure to meet special requirements.

During the crown portion of the crystal growth between the neck and the shoulder that reaches to the full body diameter, the meniscus signal can become difficult to detect. This problem can be overcome by detecting a rate of change of the meniscus signal, in addition to using the points 45 representing a signal of preferably 150% above a reference signal. Detecting a rate of change of the meniscus signal tends to locate the edge of the meniscus; and this produces a signal satisfactory for use in combination with signal points 45, controlling the crown growth.

Diameter determination during the growth of cylindrical body 32 of crystal 11 also involves melt level control 21. This preferably involves reflecting a laser beam off melt surface 20 at an angle so that a detector can determine the elevation of melt level 20 by movement of the reflected laser beam. The results of the melt level measurement are compared with the desired set point by melt level control 51 and are used to create a crucible lift signal 52 delivered to process controller 25 for implementation.

Computer 30 transforms the meniscus chord length signal information by geometry conversion 53 and by location tracking 54 of the meniscus signal. This results in a diameter calculation 55 that is filtered by programmable filtering 56 that is optimized for control of crystal body growth. The calculated diameter is compared with a predetermined diameter set point to produce a diameter control output 57 producing a seed or crystal lift signal 58 delivered to process controller 25 for implementation.

Computer 30 and other elements of the control system preferably distinguish between the body growth phase of crystal development and the neck growth phase. What has been described so far involves the body growth phase, and many of the components that are active during body growth are also active during the crystal neck growth phase. During the body growth phase, camera 40 is zoomed back to a wider angle view encompassing the full meniscus 35 of crystal 11. The filtering 56 is set for a time interval suitable for the variation of crystal lifting in response to changes in body diameter. The laser melt surface measurement 21 is also active, especially because crystal body growth reduces melt level and requires compensatory lifting of crucible 13.

During the neck growth phase at the beginning of the pull for crystal 11, the melt level measurement system continues to operate, but has practically no effect, because lifting the relatively tiny crystal neck 31 hardly lowers melt level. We also prefer that during the neck growth of the crystal, the crucible lift be shut off completely to avoid any possible mechanical disturbance. After the neck section is completed, the crucible lift is reactivated.

Figure 12:
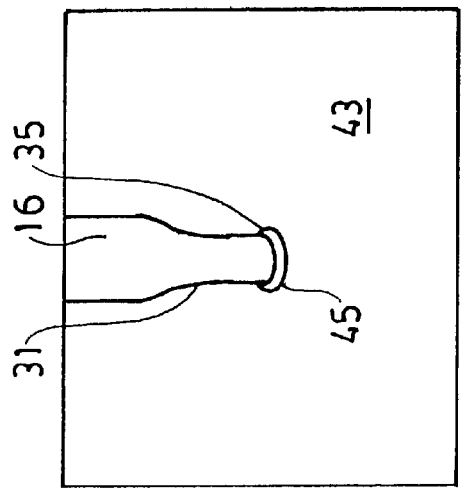
FIG. 12 is a schematic view of a neck of a crystal as seen by the camera of FIG. 2.
Figure 13:
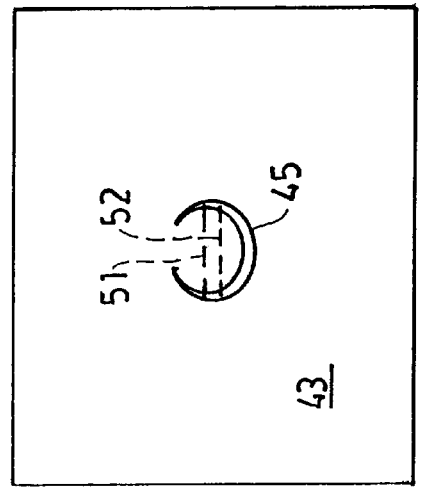
FIG. 13 is the meniscus portion of the view of FIG. 12 used for developing a control signal such as shown in FIG. 7.

For diameter control of neck 31, zoom lens 37 of camera 40 is adjusted for a close-in view of neck 31 and for enlarging the available signal from meniscus 35. This is shown in FIG. 12 where the reference numbers outside the image frame represent features being viewed; and the reference numbers inside the video frame represent signals, as graphed in FIG. 7. FIG. 13 extracts the meniscus signal 45 from FIG. 12 as used in diameter processing.

Feature extraction 50 performs an additional function during crystal neck growth. Besides identifying the length of meniscus chords, as previously explained for chords 51 and 52, feature extraction 50 also counts the total number of pixels illuminated in the CCD array in camera 40. This approximates the total illuminated size of the meniscus signal 45 that reaches the predetermined threshold above melt level reflectance 43. The total count of pixels illuminated by the meniscus signal varies quickly and reliably with changes in neck diameter so that the total illuminated pixel count is a reliable early warning of undesirable neck diameter changes.

Figure 9:
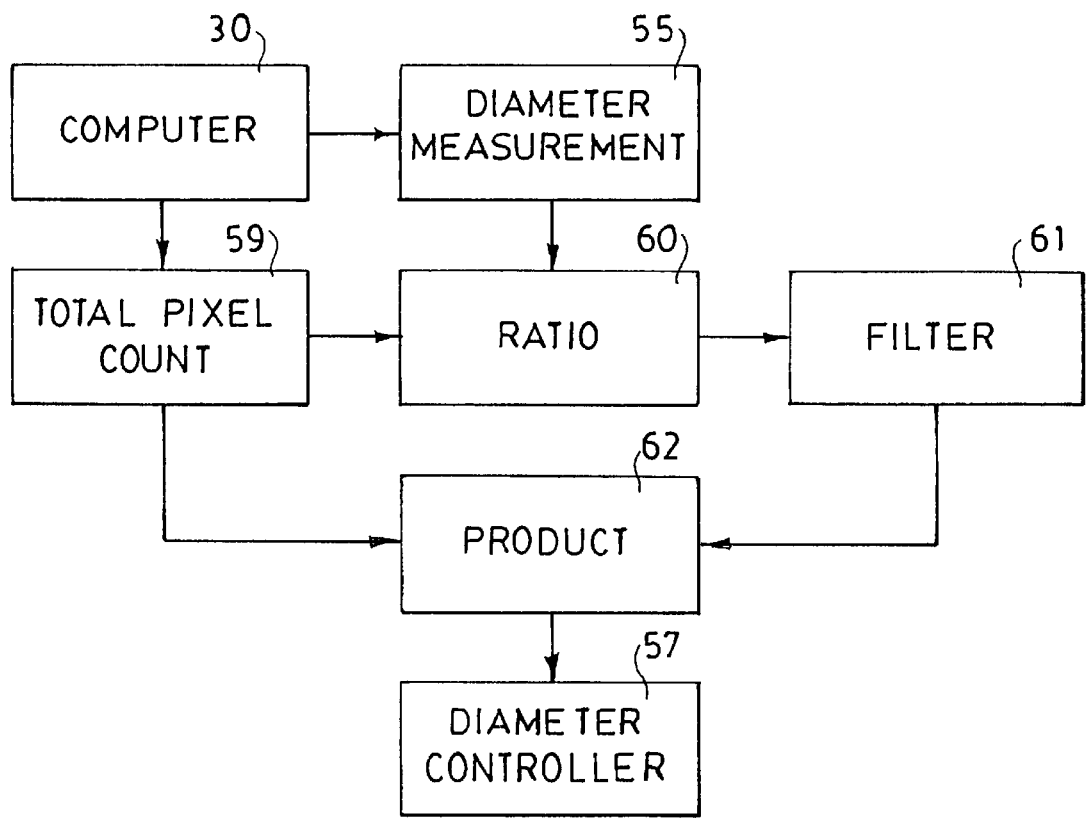
FIG. 9 is a schematic block diagram of the development of a diameter control signal used during crystal neck growth.

The total pixel illumination count is used along with the diameter calculation previously explained, but is given emphasis because of its proven reliability in responding rapidly to small neck diameter changes. This is best explained in FIG. 9. Under the control of computer 30, the total pixel count 59 and the calculated diameter measurement 55 are both created and are combined in a ratio 60. This is preferably formed by dividing the total pixel count 59 by the calculated diameter 55, but other ways of combining the two parameters together can also be used. The ratio 60, which is formed of a part of the feature extraction 50 in the neck growth phase, is filtered by filter 61 over a short time interval. Different time intervals can be made to work for this, including intervals on the order of one or two seconds. Longer filter intervals of up to about two minutes are also possible. The product 62 of the filtered ratio and the total pixel count 59 are then sent to diameter controller 57 for comparison with the set point and for producing a seed lift signal 58. Just as ratio 60 can be formed in various ways, so also can product 62 result from various combinations of the filtered ratio and the total pixel count. The objective is to emphasize the total pixel count as a control factor, especially for short range control objectives, and to preserve the calculated diameter function, especially for longer range control objectives. In other words, control system 10 responds rapidly to changes in the total pixel count and responds more slowly to changes in the calculated diameter during crystal neck growth.

The total pixel illumination count 59 and the calculated diameter measurement 55 can also be combined by "fuzzy logic" rather than by a predetermined ratio. By fuzzy logic, the crystal neck growth could be controlled primarily by chord length, but the control would react rapidly to sudden drops in meniscus area represented by total pixel count 59. Fuzzy logic would generally allow a neck control to behave similarly to the control implementation explained above.

When growth of neck 31 is completed, the crystal pulling rate is slowed down to produce a gradual diameter increase to a shoulder region of crystal 11, whereupon the control mode changes from crystal neck growth to shoulder and body growth. This involves moving zoom lens 37 back to a wider angle, discontinuing the total pixel count 59, ratio 60, and filtering 61, while maintaining other aspects of diameter control and melt level control.

The various components of the preferred system can be embodied in many different configurations of devices. A present preference is for industrial PC computer 30 to include everything in FIG. 6 except the melt measurement 21, the camera 40, the crucible lift 52, the processor 25, and the seed lift 58.

We claim:

1. A system controlling the diameter of a monocrystalline rod being pulled from molten material held in a crucible, the system using at least one video camera arranged to view a meniscus around the rod where the rod emerges from a melt surface of the molten material so that an image of the meniscus is incident on a camera pixel array, and the system comprising:
   a. a lens system arranged to provide a close in view of a neck growth region of the rod and to provide a wide angle view of a body growth region of the rod so that the image of the meniscus on a pixel array is relatively enlarged during neck growth and is relatively reduced during full diameter growth;
   b. a computer arranged for calculating and controlling crystal diameter from the meniscus image during both neck growth and full diameter growth;
   c. the computer being supplied with a count of total camera pixels illuminated by the image of the meniscus during neck growth; and
   d. the computer responding rapidly to the total pixel count for varying a rod pulling rate during neck growth.

2. The system of claim 1 including a sensor determining the level of the melt surface and supplying melt level information to the computer.

3. The system of claim 1 wherein the lens system is a zoom lens for a single video camera and including a pneumatic motor and belt drive for the zoom lens.

4. The system of claim 3 wherein the zoom lens drive includes stops for in and out positions.

5. The system of claim 4 wherein the pneumatic drive includes a clutch arranged for slipping when the drive reaches the stops.

6. The system of claim 1 wherein the computer responds slowly to diameter calculation for varying the rod pulling rate during neck growth.

7. A diameter control system for forming both a neck region and a full diameter region of a monocrystalline rod being pulled from molten material held in a crucible, the system using a video camera for monitoring light reflected from a meniscus around the rod where the rod emerges from the melt surface, and the system comprising:
   a. a computer for calculating rod diameter from a plurality of chords extending across an arc of the meniscus;
   b. a count of the total number of pixels illuminated by the image of the meniscus during neck growth being supplied to the computer; and
   c. a rod pulling rate controlled by the computer during neck growth being responsive to the total pixel count during neck growth.

8. The system of claim 7 wherein the rod pulling rate controlled by the computer also responds to calculated rod diameter during neck growth but responds more rapidly to the total pixel count and less rapidly to the calculated rod diameter during neck growth.

9. The system of claim 7 including a melt level detector arranged for communicating melt level information to the computer for use in calculating rod diameter.

10. The system of claim 7 wherein a video camera system receives an enlarged camera image of the meniscus during neck growth and a reduced image of the meniscus during full diameter growth.

11. In a system for controlling diameter of a monocrystalline rod being pulled from molten material held in a crucible, the system using a video camera viewing light reflected from a meniscus around the rod where the rod emerges from a melt surface of the molten material, the improvement comprising:
   a. the video camera having a lens forming a large image of the meniscus during growth of a neck of the rod; and
   b. a computer controlling a pull rate for the neck growth of the rod being responsive to a count of total camera pixels illuminated by the large image of the meniscus during neck growth.

12. The improvement of claim 11 wherein the computer calculates rod diameter at the meniscus from a plurality of chord lengths extending across an arc of the meniscus.

13. The improvement of claim 12 wherein the computer makes the pulling rate for the neck growth respond rapidly to the total illuminated pixels and respond less rapidly to rod diameter calculated from the chord lengths.

14. The improvement of claim 11 including a melt surface level sensor supplying melt level information to the computer for use in calculating rod diameter from the chord lengths.

* * * * *